(12) United States Patent
Yu et al.

(10) Patent No.: US 6,809,363 B2
(45) Date of Patent: Oct. 26, 2004

(54) STORAGE ELECTRODE OF A SEMICONDUCTOR MEMORY DEVICE

(75) Inventors: Young Sub Yu, Gyeonggi-do (KR); Seok Sik Kim, Chungcheongnam-do (KR); Ki Hyun Hwang, Gyeonggi-do (KR); Han Jin Lim, Seoul (KR); Sung Je Choi, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/418,090

(22) Filed: Apr. 18, 2003

(65) Prior Publication Data

US 2004/0018679 A1 Jan. 29, 2004

Related U.S. Application Data

(62) Division of application No. 10/012,557, filed on Dec. 12, 2001, now Pat. No. 6,583,056.

(30) Foreign Application Priority Data

Mar. 3, 2001 (KR) .......................................... 2001-10972

(51) Int. Cl.[7] .............................................. H01L 21/108
(52) U.S. Cl. ........................ 257/296; 257/303; 257/309
(58) Field of Search ................................. 257/296, 301, 257/306, 307, 308, 309, 310

(56) References Cited

U.S. PATENT DOCUMENTS

| | | | |
|---|---|---|---|
| 5,100,825 A | 3/1992 | Fazan et al. | |
| 5,434,812 A | 7/1995 | Tseng | |
| 5,468,684 A | 11/1995 | Yoshimori et al. | |
| 5,545,585 A | 8/1996 | Wang et al. | |
| 5,763,286 A | 6/1998 | Figura et al. | |
| 5,885,865 A | 3/1999 | Liang et al. | |
| 5,943,581 A * | 8/1999 | Lu et al. ..................... | 438/386 |
| 6,022,772 A | 2/2000 | Watanabe et al. | |
| 6,168,987 B1 | 1/2001 | Jeng et al. | |
| 6,215,187 B1 | 4/2001 | Ooto et al. | |
| 6,222,722 B1 | 4/2001 | Fukuzumi et al. | |
| 6,258,689 B1 * | 7/2001 | Bronner et al. ............. | 438/386 |
| 6,268,244 B1 | 7/2001 | Park | |
| 6,271,084 B1 * | 8/2001 | Tu et al. ..................... | 438/253 |
| 6,312,986 B1 | 11/2001 | Hermes | |
| 6,586,312 B1 * | 7/2003 | Chin et al. .................. | 438/396 |
| 6,682,984 B1 * | 1/2004 | Wu et al. .................... | 438/397 |
| 2001/0018248 A1 | 8/2001 | An | |
| 2001/0034114 A1 | 10/2001 | Liaw | |
| 2002/0000596 A1 | 1/2002 | Carstensen | |
| 2002/0019107 A1 | 2/2002 | Lin et al. | |
| 2002/0028553 A1 | 3/2002 | Yokoyama et al. | |

FOREIGN PATENT DOCUMENTS

| | | |
|---|---|---|
| JP | 4-3-259567 | 11/1991 |
| JP | 4-5-6974 | 11/1993 |
| JP | 11214645 | 8/1999 |
| JP | 2001-57413 | 2/2001 |
| KR | 2001-0011167 | 2/2001 |

OTHER PUBLICATIONS

Fukuzumi et al., Liner–Supported Cylinder (LSC) Technology to realize Ru/TA2O5/Ru Capacitor for Future DRAMs, 2000, IEEE, IEDM 00, pp. 793–96.

* cited by examiner

Primary Examiner—Tuan H. Nguyen
(74) Attorney, Agent, or Firm—Volentine Francos & Whitt, PLLC

(57) ABSTRACT

A storage electrode has a truncated-conical "pipe-shaped" top section having a small inner diameter, mounted on a cylindrical base section having a large inner diameter. To fabricate the storage electrode, a buried contact plug is formed on a first insulating layer on a wafer, and an etching stop layer and a second insulating layer are formed on the first insulating layer. A third insulating layer is formed on the second insulating layer after implanting impurities into the second insulating layer. An opening is formed by anisotropically etching the third insulating layer and the second insulating layer using a photoresist pattern as an etching mask. A cleaning process is carried out such that the second insulating layer exposed through the opening is isotropically etched. After depositing polysilicon along a profile of the second and third insulating layers to a uniform thickness, the remaining third and second insulating layers are removed.

18 Claims, 11 Drawing Sheets

STORAGE ELECTRODE OF A
SEMICONDUCTOR MEMORY DEVICE

CROSS REFERENCES TO RELATED
APPLICATIONS

This is a divisional application of application Ser. No. 10/012,557, filed Dec. 12, 2001, now U.S. Pat. No. 6,583,056 which is hereby incorporated by reference in its entirety for all purposes.

This application claims priority under 35 U.S.C. § 119 to Korean Patent Application No. 2001-10972, filed on Mar. 3, 2001, the entirety of which is hereby incorporated by reference herein for all purposes as if fully set forth herein.

BACKGROUND OF THE INVENTION

1. Field of the Invention

The present invention relates to a storage electrode and a method for fabricating the same, and more particularly to a high storage electrode having a stable structure which can be prevented from falling down when installed in a limited cell area, and a method for fabricating the same.

2. Description of the Related Art

Recently, as the integration degree of a memory device, such as a DRAM, increases various methods are studied and developed for obtaining sufficient capacitance in a limited cell area. In order to increase the cell capacitance, a material having a high dielectric constant is used as a capacitor dielectric layer, an effective area of a cell capacitor is enlarged by growing an HSG (hemisphere silicon grain), and/or a high dielectric material is used as a dielectric layer.

Besides the HSG method, in which the effective area is enlarged by a concave and convex surface structure, a technique for raising the height of a storage electrode layer forming the cell capacitor is introduced in order to enlarge the effective area of the cell capacitor. Since the HSG process is complicated and increases the manufacturing cost, techniques for raising the height of the storage electrode of a capacitor are being studied and developed.

In order to obtain sufficient cell capacitance in a small cell area, a capacitor having a height more than 15,000 Å is introduced into the gigabit DRAM. As the cell area becomes smaller, the height of the capacitor is relatively increased so that the storage electrode is tilted or, in an extreme case, falls down.

Generally, in a cylindrical capacitor, an opening is formed in an insulating layer and a cylindrical storage electrode is formed along the profile of a bottom and a sidewall of the opening. The bottom of the opening formed in the insulating layer is relatively narrower than an inlet of the opening due to a loading effect created during an etching process. Accordingly, the sidewall of the opening is sloped.

Polysilicon is coated on the bottom and the sidewall of the opening along the profile of the opening, so that a polysilicon storage electrode layer has an unstable structure. That is, a bottom portion of the polysilicon storage electrode layer is narrower than an inlet portion of the polysilicon storage electrode layer. In addition, when a peripheral insulating layer is removed, the sidewall of the storage electrode layer has a reverse-inclination so that the storage electrode layer is tilted due to the weight thereof and easily falls down if an impact is applied thereto when a wafer is moved for the following process.

A method for fabricating a cylindrical storage electrode will be described with reference to FIGS. 1 to 3.

FIGS. 1 to 3 are sectional views showing the process steps for forming a cylindrical storage electrode layer of a semiconductor memory device.

Referring to FIG. 1, in order to provide a DRAM cell, a trench type field oxide layer 12 is formed on a silicon substrate 10 and an active device is formed in an active area. Generally, the active device is a metal oxide semiconductor (MOS) transistor.

The MOS transistor includes a gate electrode having a stacked structure of a polysilicon layer 16 and a tungsten silicide layer 18 formed on a gate oxide layer 14. The gate electrode is protected by a sidewall spacer 20 and a mask layer 32 which are comprised of insulating materials. Source and drain regions are formed by implanting impurities into surface portions of the active area of the silicon substrate 10 by using a gate electrode layer as an ion implanting mask.

Self-aligned contact holes are formed for the drain and source regions. Then, a conductive material, such as doped-polysilicon, is filled in the contact hole so as to form contact plugs 24 and 26.

Then, the MOS transistor is covered with an insulating layer 28 and the surface of the insulating layer 28 is polished by means of a chemical mechanical polishing (CMP) process.

After forming a bit line contact in the insulating layer 28 and exposing a drain contact plug 24, a bit line 30 is formed. The bit line 30 is protected by a sidewall spacer 32 and a mask layer 34 which are comprised of insulating materials.

The surface formed with the bit line 30 is coated with an insulating layer 36. Then, the surface of the insulating layer 36 is polished by means of the CMP process.

An opening is formed in the insulating layer 36 by a photolithography process. Then, a buried contact plug 37 is formed by filling polysilicon into the opening.

An etching stop layer 38 is formed by coating a nitride layer on the insulating layer 36. Then, an insulating layer 40 having a thickness of 15,000 Å is coated on the etching stop layer 38 and a photoresist pattern 42 for defining a capacitor forming area is formed thereon.

An opening 44 is formed by anisotropically and sequentially etching the insulating layer 40 and the anti-reflective layer 36 using the photoresist pattern as an etching mask. Accordingly, an upper surface of the buried contact plug 37 is exposed at a bottom 44b of the opening 44.

At this time, the bottom 44b of the opening 44 is narrower than an inlet 44a of the opening 44. That is, the bottom critical dimension becomes narrower than the critical dimension of the opening. Therefore, the sidewalls of the opening 44 are sloped. The reason is that the etching rate of the bottom is lower than the etching rate of the inlet due to the loading effect generated during the etching process. The loading effect extremely appears as the depth of the opening becomes deeper, that is as the height of the storage electrode layer becomes higher.

Referring to FIG. 2, after stripping the photoresist pattern 42 which is used as the etching mask, a polysilicon layer 46 is coated to a uniform thickness along a profile of the insulating layer 40 exposed through the openings 44.

Referring to FIG. 3, the polysilicon layer 46 formed on the upper surface of the insulating layer 40 is removed by performing an etch back process so that the polysilicon layer 46 is defined by each of the openings 44. Then, the remaining insulating layer 40 is removed so that the storage electrode layer having the bottom narrower than the inlet thereof is obtained as shown in FIG. 3.

However, the above storage electrode layer has a geometrically unstable structure due to the unbalanced structure of the inlet, the bottom and the sidewalls thereof, which is inclined so as to have a greater inlet than the bottom. For this reason, the storage electrode layer is tilted caused by the weight thereof, or, in extreme case, the storage electrode layer falls down thereby causing the failure of the cell.

If the storage electrode layer is tilted towards an adjacent storage electrode layer, a two-bit error may occur so that the reliability of a semiconductor device is lowered.

In addition, if the storage electrode layer falls down, the cell fails so that the yield rate of the semiconductor device is lowered.

SUMMARY OF THE INVENTION

Therefore, it would be desirable to provide a storage electrode of a semiconductor memory device having a geometrically stable structure, in which a base of the storage electrode layer is larger than a top of the storage electrode layer.

It would also be desirable to provide a method which is suitable for fabricating the above storage electrode.

The present invention has been made to address the above problems of the prior art. Other objects and advantages will appear hereafter.

In one aspect of the invention, there is provided a storage electrode of a semiconductor memory device. The storage electrode has a cylindrical base section having a first inner diameter and a truncated-conical "pipe-shaped" top section having a second inner diameter smaller than the first inner diameter. An upper end of the base section and a lower end of the top section extended towards each other at a same height so as to be connected to each other.

In another aspect of the invention, a storage electrode for a semiconductor device, includes a hollowed-out bottom section disposed on a substrate and a hollowed-out top section disposed on the hollowed-out bottom section, wherein a largest cross-section of the hollowed-out top section taken along a plane parallel to the substrate is smaller than a smallest cross-section of the hollowed-out bottom section taken along the plane parallel to the substrate.

Beneficially, a height of the base section is about 1,000 to 5,000 Å and a height of the top section is about 5,000 to 15,000 Å. Beneficially, a height of the storage electrode layer is at least 15,000 Å.

In yet another aspect of the present invention, there is provided a method for fabricating the storage electrode. A wafer having a first insulating layer formed with a buried contact plug is prepared. An etching stop layer is formed on the first insulating layer formed with the buried contact plug. A second insulating layer is formed on the etching stop layer with a predetermined thickness, and then an impurity is implanted into the second insulating layer. A third insulating layer is formed on the second insulating layer with a predetermined thickness. A photoresist pattern for defining a capacitor forming area is formed on the third insulating layer and then an opening is formed by anisotropically etching the third insulating layer, the second insulating layer and the etching stop layer, in sequence, by using the photoresist pattern as an etching mask in such a manner that an upper surface of the buried contact plug is exposed. After removing the photoresist pattern, a cleaning process is performed against the resulting structure such that the second insulating layer exposed through the opening is isotropically etched. After depositing polysilicon along a profile of the second and third insulating layers to a uniform thickness, the polysilicon deposited on an upper surface of the third insulating layer is removed. The remaining third and second insulating layers are removed to obtain the storage electrode of a semiconductor memory device.

Beneficially, the predetermined thickness of the second insulating layer is in a range of about 1,000 to 5,000 Å and the predetermined thickness of the third insulating layer is in a range of about 5,000 to 15,000 Å.

Beneficially, Ar or $N_2$ is implanted into the second insulating layer as an impurity. By implanting the impurity into the second insulating layer, the second insulating layer is more rapidly isotropically-etched than the third insulating layer. An SC1 solution, an HF solution, or a mixed solution thereof may be used as a cleaning liquid in the cleaning step.

An anti-reflective layer may be formed on the third insulating layer.

The second and third insulating layers may be comprised of PE-TEOS.

Beneficially, instead of implanting the impurity into the second insulating layer, the third insulating layer having an etching rate smaller than an etching rate of the second insulating layer is used when an isotropic etching process is carried out. In this case, an isotropic etching rate of the second insulating film is greater than an isotropic etching rate of the third insulating film by a factor of about 1.5 to 3 times.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE PREFERRED EMBODIMENTS

Figure 1:
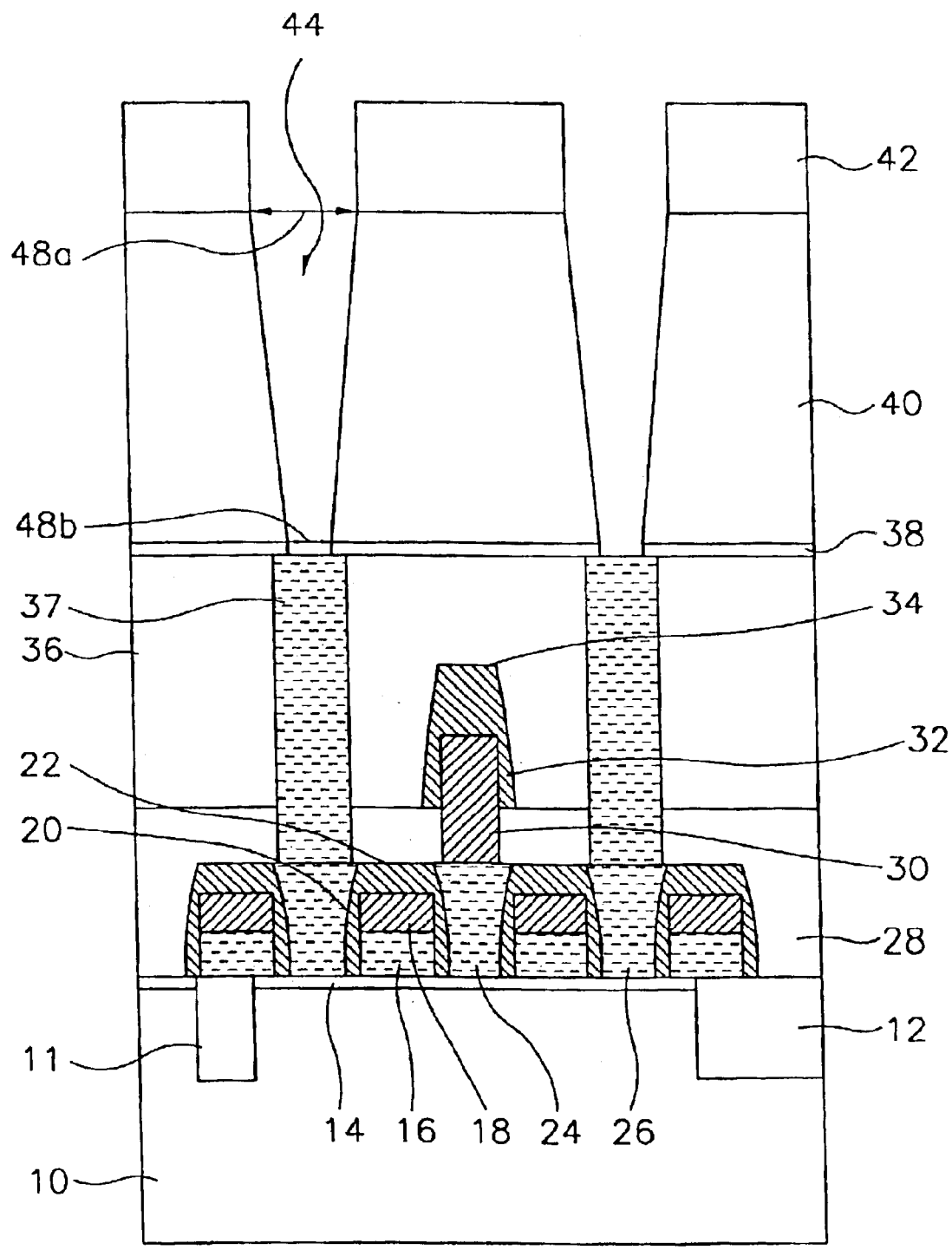
FIGS. 1 to 3 are sectional views showing the process steps for forming a cylindrical storage electrode layer of a semiconductor memory device.
Figure 2:
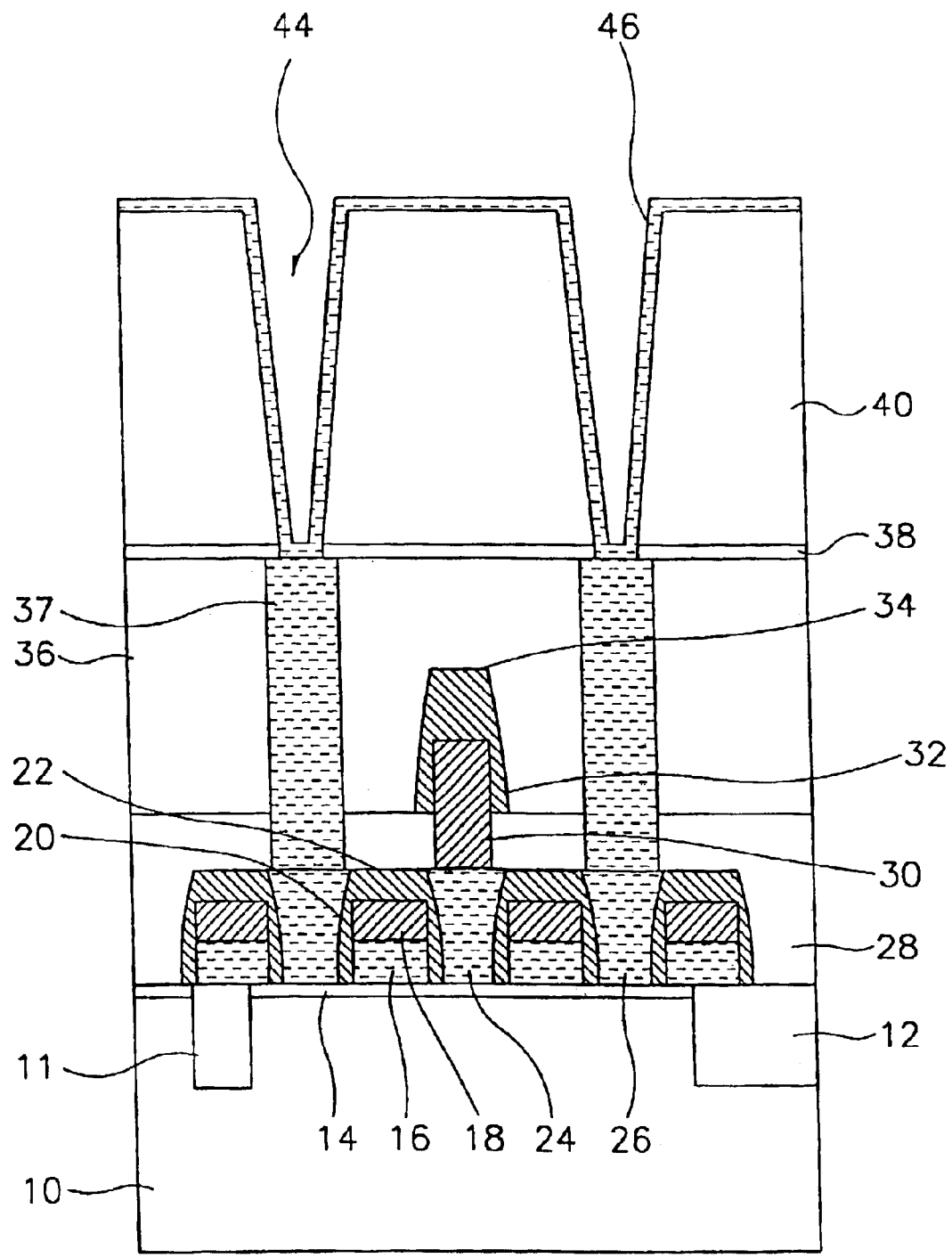
Figure 3:
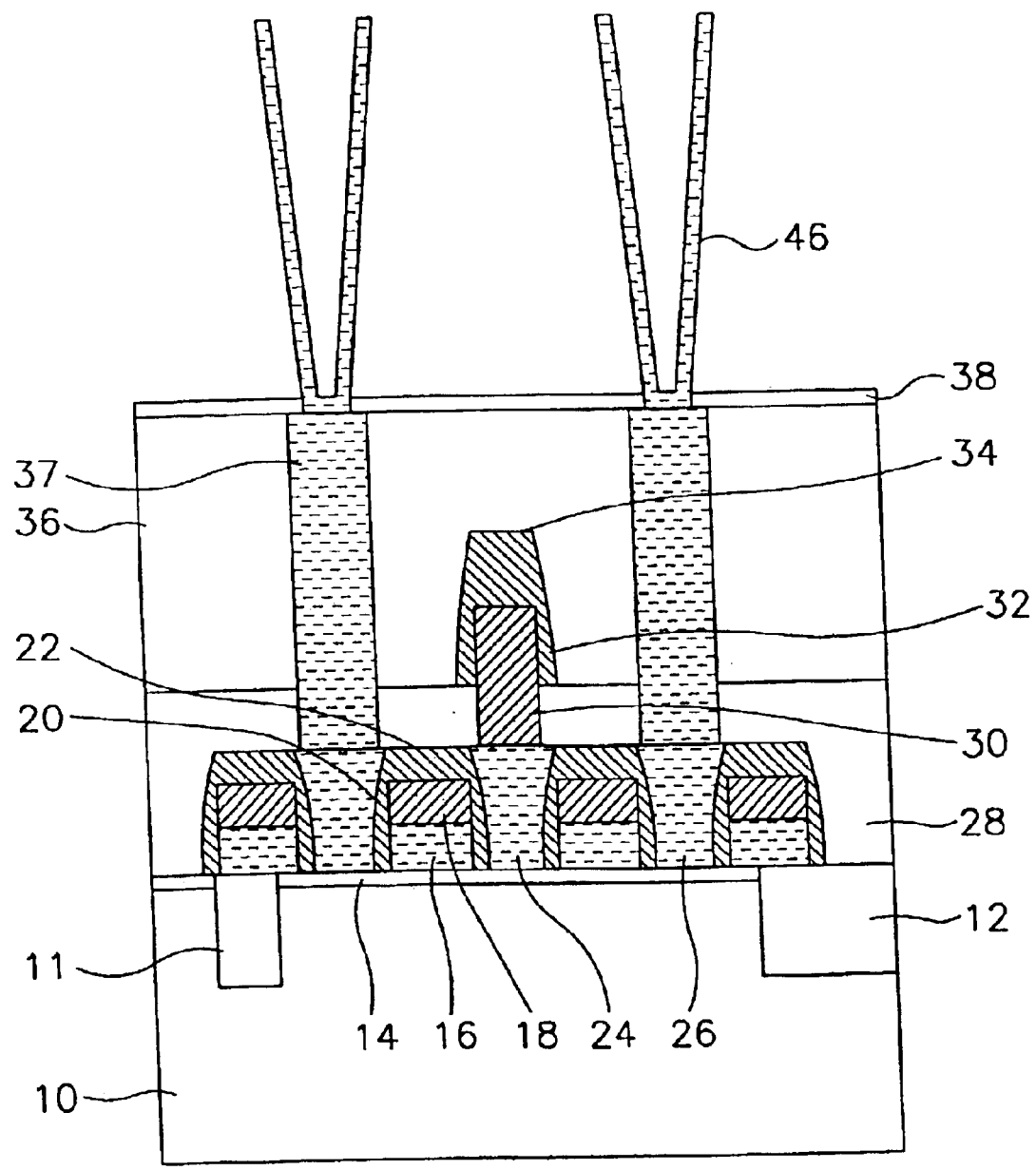

Hereinafter, one preferred embodiment of the present invention will be described in detail with reference to FIGS. 4 to 11. In the present embodiment, the same reference numerals are used for the elements identical to those of FIGS. 1 to 3.

Figure 4:
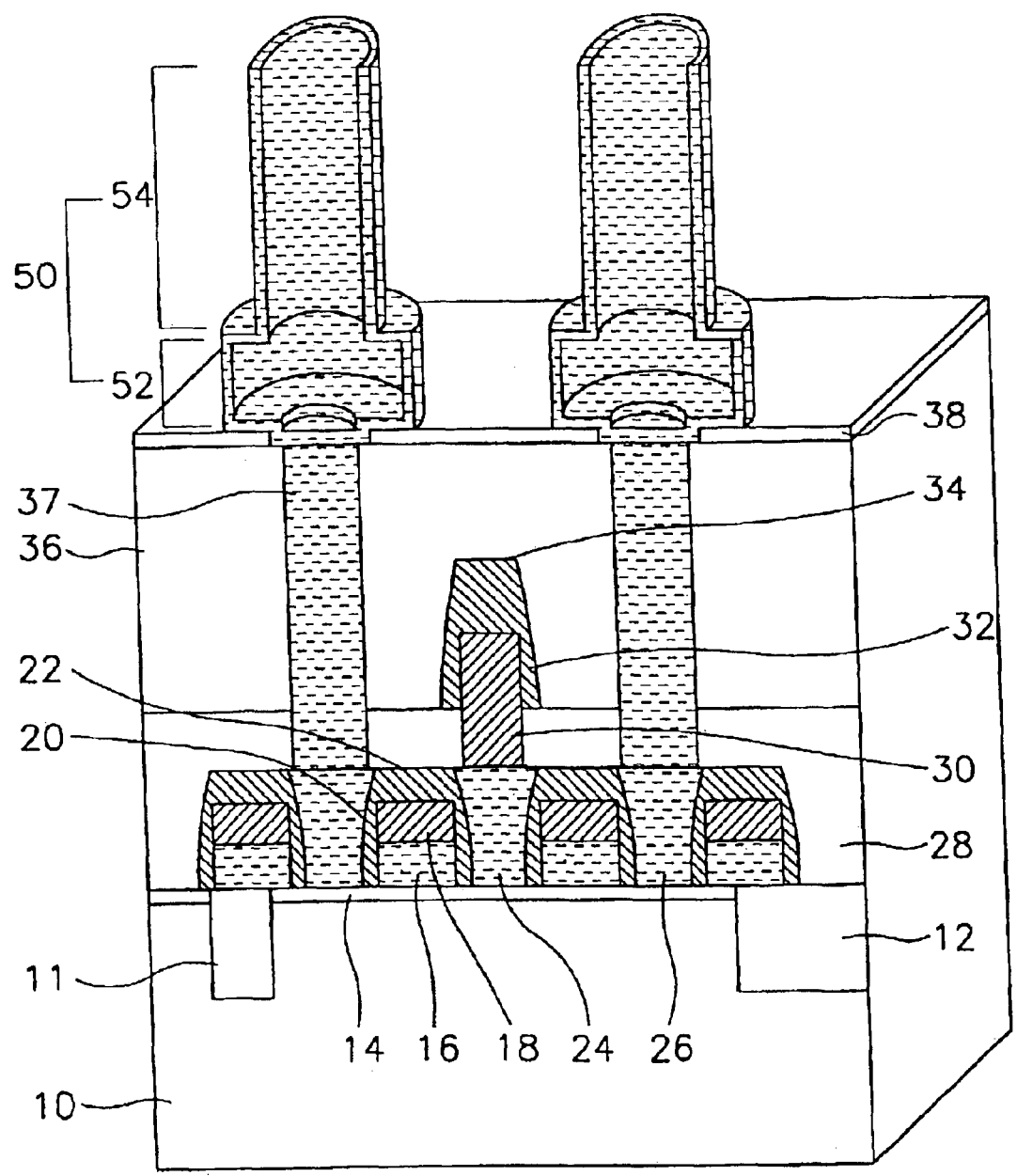
FIG. 4 is a sectional perspective view showing a structure of storage electrode layer of a semiconductor memory device according to one embodiment.

FIG. 4 shows a storage electrode having a stable structure according to one embodiment of the present invention.

The storage electrode 50 consists of a base section 52 and a top section 54. The base section 52 has a cylindrical shape and is formed at a bottom of the storage electrode layer 50. An underside of the base section makes contact with an upper surface of a buried contact plug 37.

The top section 54 has a "pipe" shape, beneficially, in the shape of a truncated cone.

Beneficially, as shown in FIG. 4, the base section 52 is of a hollowed-out cylindrical shape. Similarly, the "pipe-shaped" top section 54 if of a hollow-out truncated cone shape, although a hollowed-out cylindrical shape is also possible. An inner diameter of the cylindrical base section 52 is larger than an inner diameter of the "pipe-shaped" top section 54.

An upper end of the base section 52 and a lower end of the top section 54 extend towards each other at the same height so as to be connected to each other.

Beneficially, the height of the storage electrode layer 50 is at least 15,000 Å, the height of the base section 52 is in the range of 1,000 to 5,000 Å, and the height of the top section 54 is in the range of 5,000 to 15,000 Å.

As shown in FIG. 4, the top section 54 having a small diameter is mounted on the base section 52 having a large diameter, so the storage electrode layer 50 has the geometrically stable structure. That is, the bottom of the storage electrode layer 50 is larger than an inlet thereof.

Hereinafter, a method for fabricating the storage electrode layer according to one embodiment will be described with reference to FIGS. 5 to 11.

Figure 5:
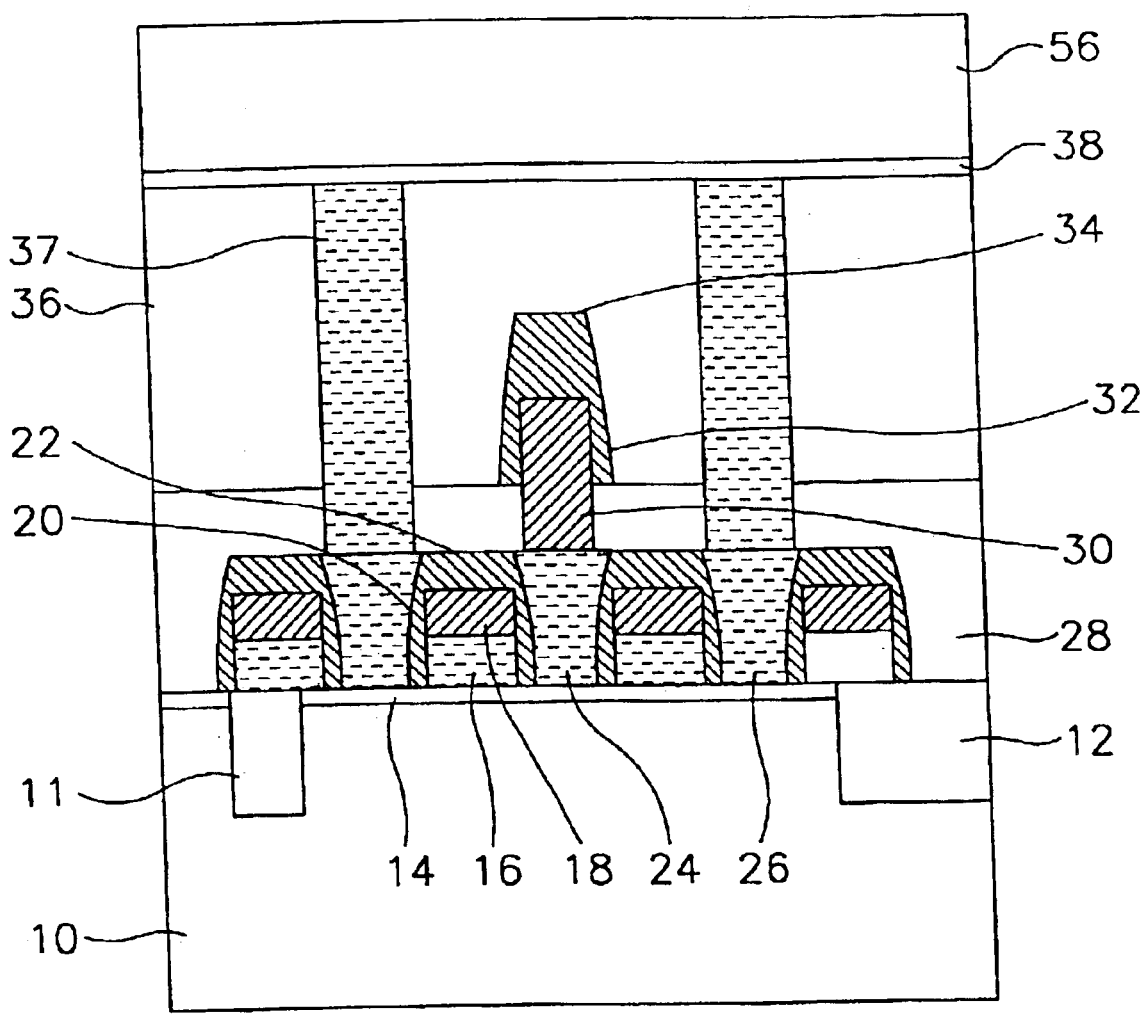
FIGS. 5 to 11 are sectional views showing the process steps for forming the storage electrode layer of the semiconductor memory device according to one embodiment.

Referring to FIG. 5, an etching stop layer 38, such as a nitride layer, is formed on a wafer provided with a cell transistor, a bit line and a buried contact plug. Then, plasma-enhanced tetraethyl orthosilicate (PE-TEOS) oxide is deposited thereon to a thickness of 1,000 to 5,000 Å, thereby forming an insulating layer 56.

Figure 6:
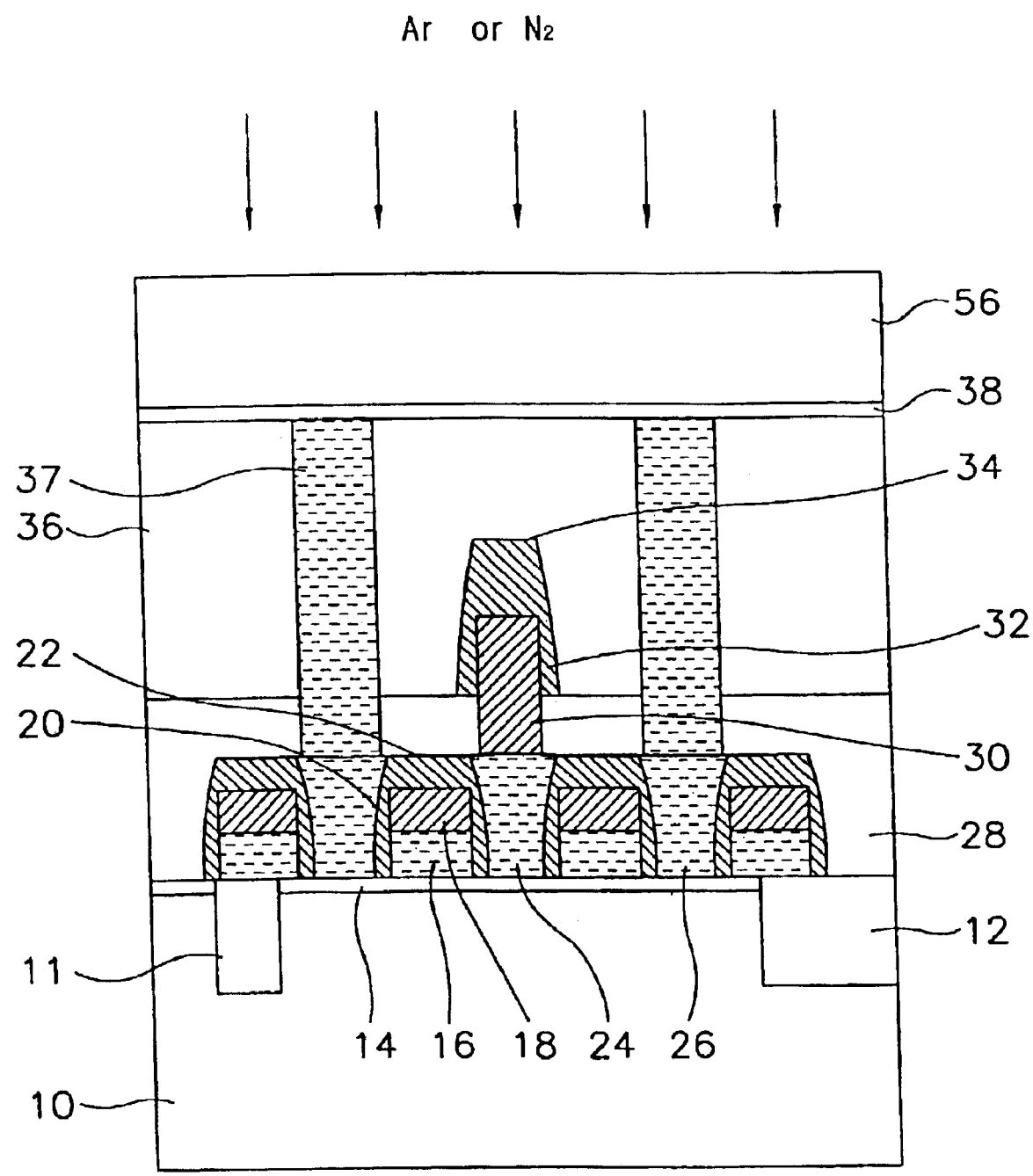

Referring to FIG. 6, impurities such as Ar or $N_2$ are implanted into the insulating layer 56 in order to increase the etching rate when the cleaning process is carried out.

Figure 7:
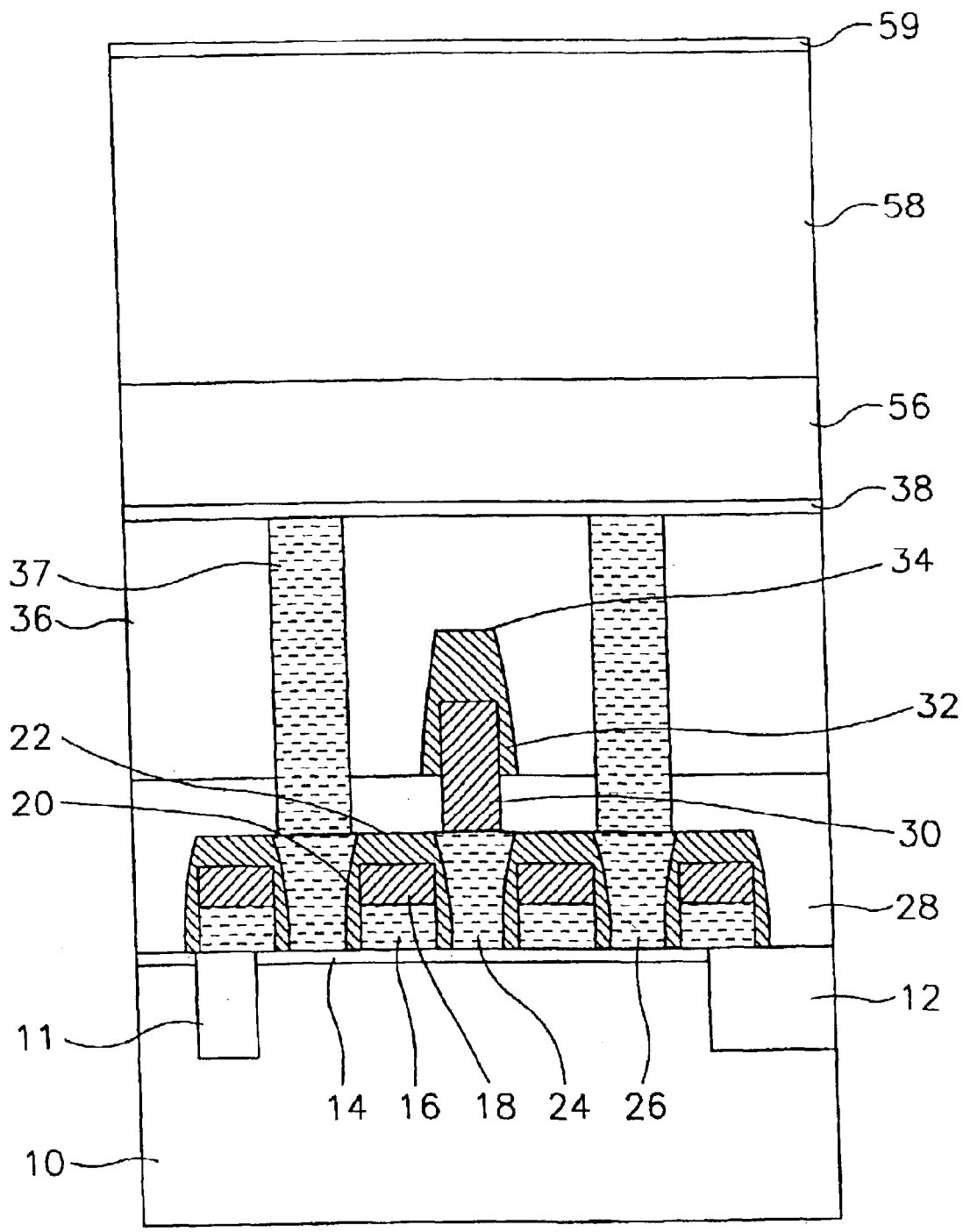

Referring to FIG. 7, PE-TEOS oxide is deposited on the insulating layer 56 to a thickness of 5,000 to 15,000 Å, thereby forming an insulating layer 58. Then, an anti-reflective layer 59 is formed thereon.

Figure 8:
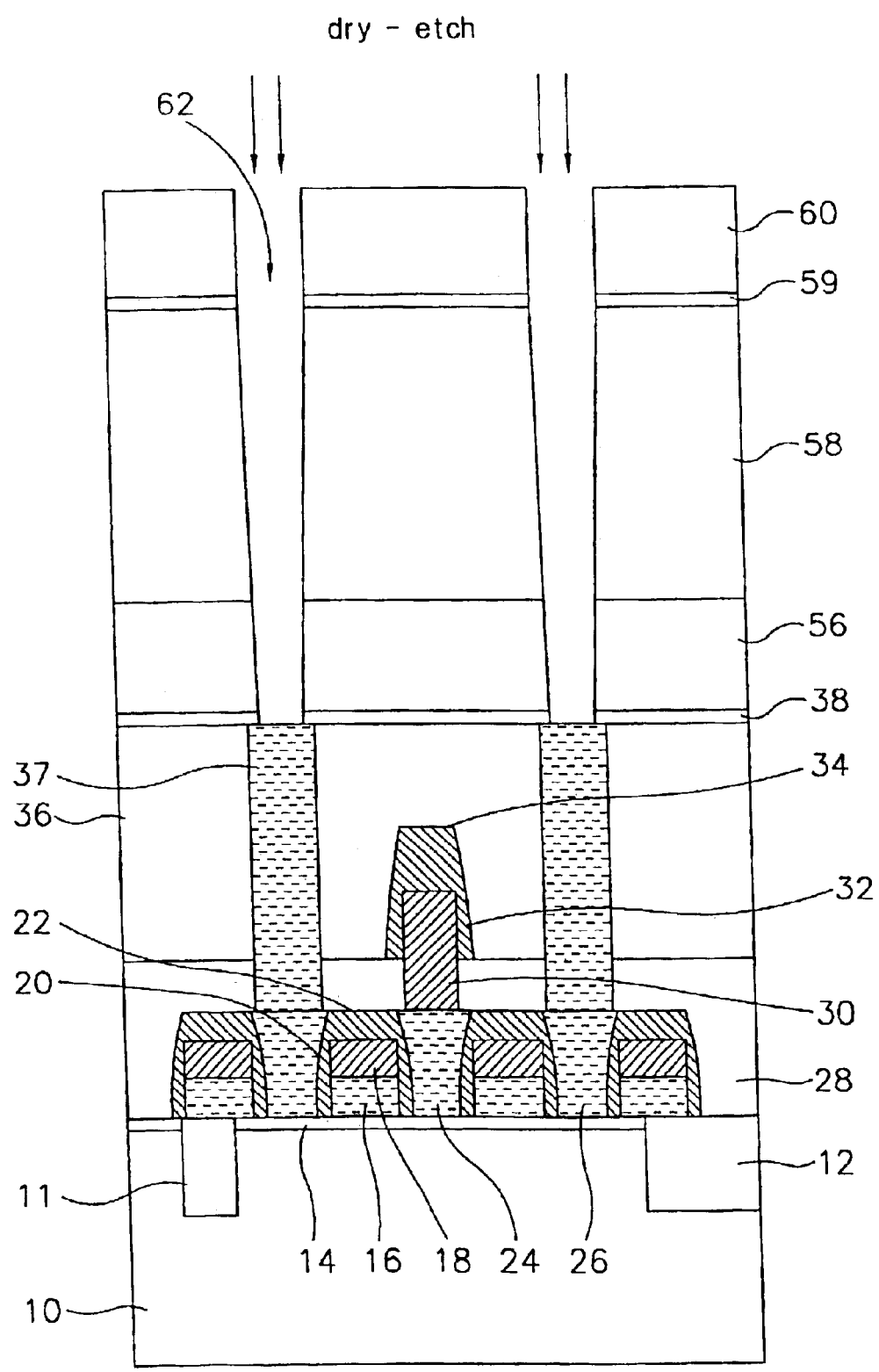

Referring to FIG. 8, a photoresist pattern 60 for defining a capacitor is formed on the anti-reflective layer 59. Then, the anti-reflective layer 59, the insulating layers 58 and 56, and the etching stop layer 38 are sequentially dry-etched by using the photoresist pattern 60 as an etching mask, thereby forming openings 62. As described above, a bottom of the opening 62 is narrower than an inlet of the opening 62 due to the loading effect, and sidewalls of the openings are reversely inclined.

Figure 9:
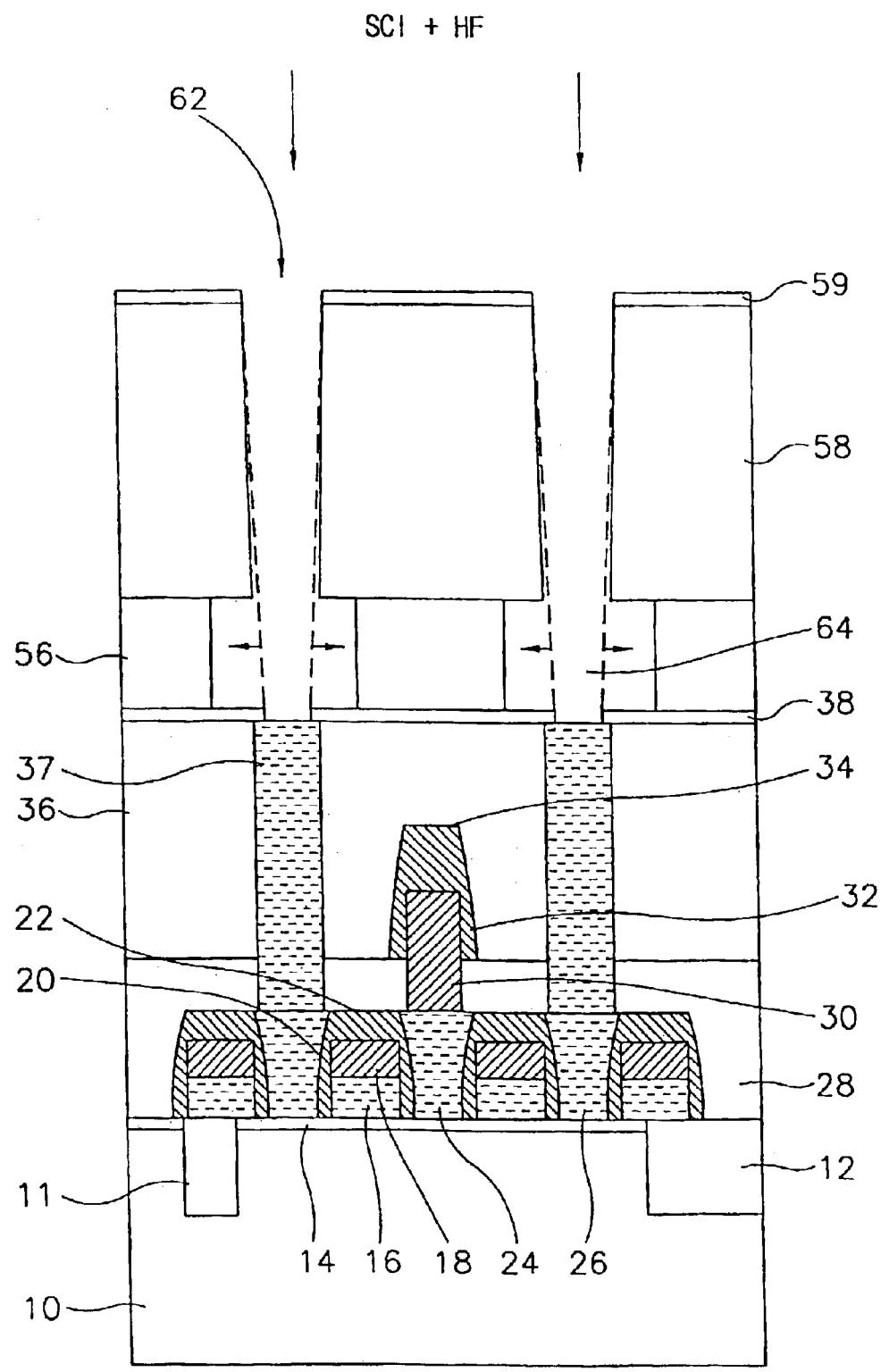

Referring to FIG. 9, the photoresist pattern 60 used for the etching mask is removed by means of a stripping process. Then, the resulting structure is cleaned by using a cleaning liquid, such as SC1 and HF solution. The insulating layers 56 and 58 are isotropically wet-etched by the cleaning liquid. At this time, since the etching rate of the insulating layer 56 is about 1.5 to 3 times higher than the etching rate of the insulating layer 58, a space 64 which is larger than the inlet is formed at the bottom of the storage electrode layer. That is, a large bottom critical dimension is achieved. The space 64 is provided as the base section of the storage electrode layer.

Figure 10:
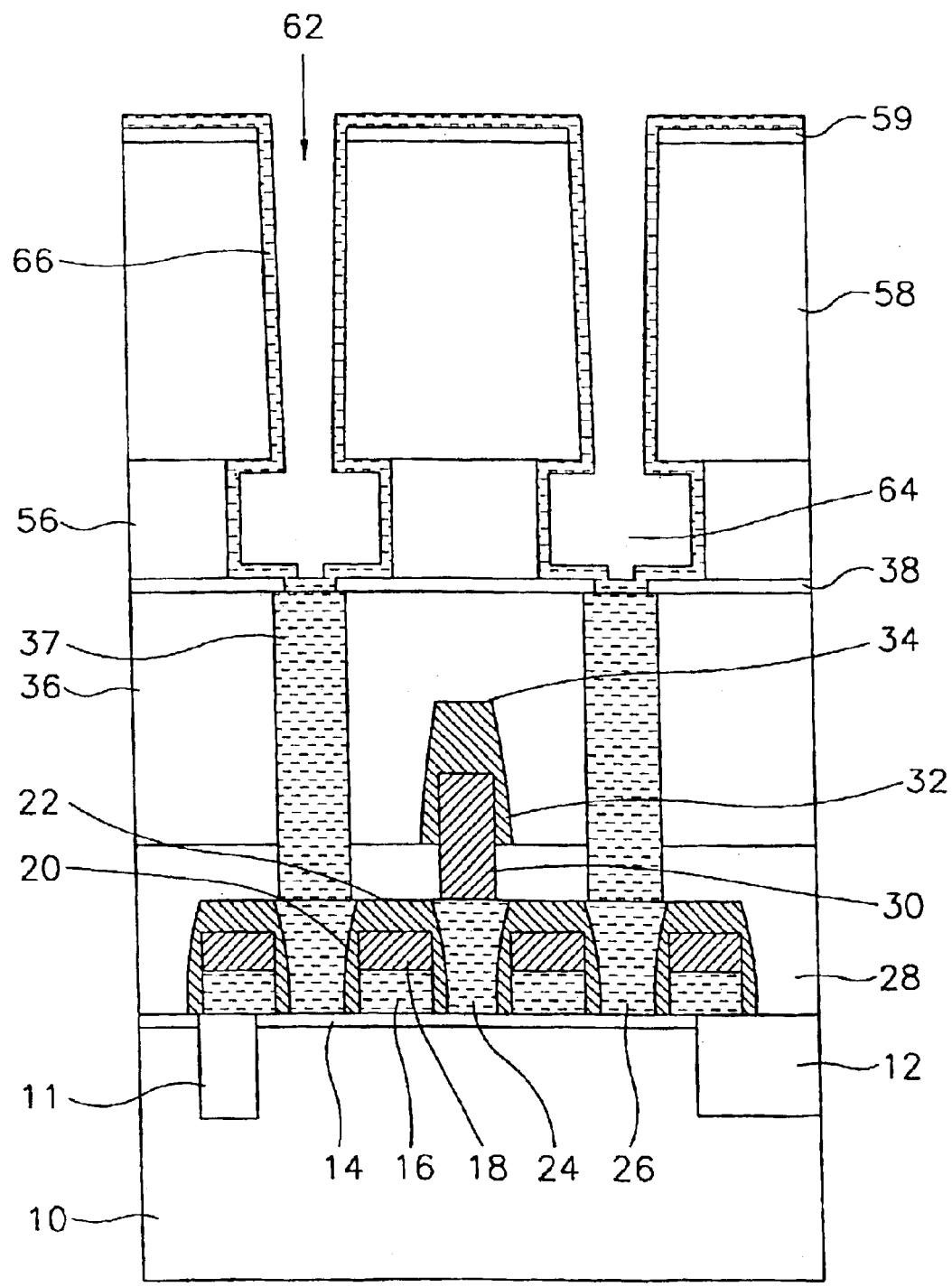

Referring to FIG. 10, a polysilicon layer is uniformly deposited along a sidewall profile of the insulating layers 56 and 58, which are exposed through the opening 62 and the space 64, thereby forming a polysilicon layer 68.

Figure 11:
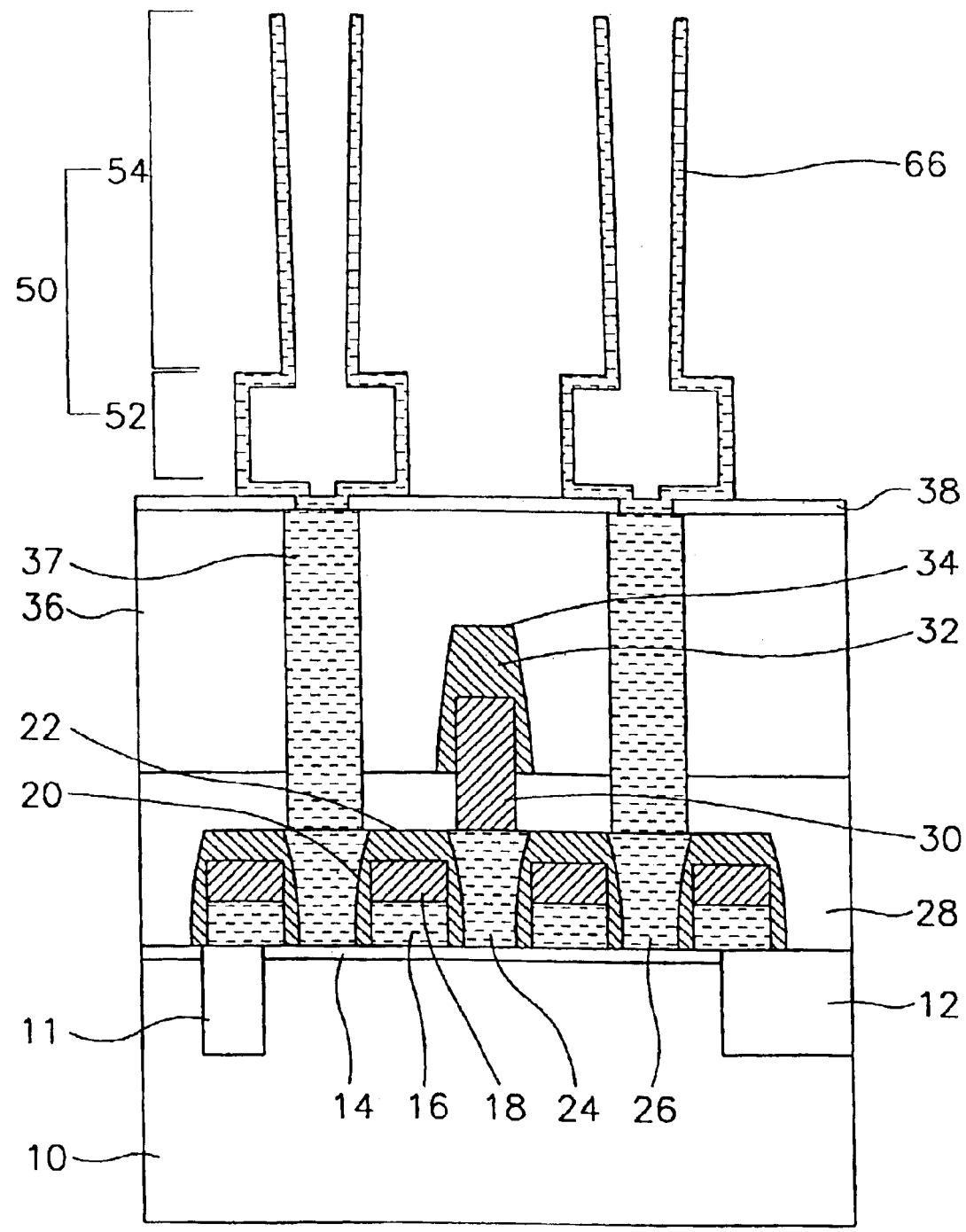

Referring to FIG. 11, the polysilicon layer exposed at an upper surface of the insulating layer 58 is removed by performing an etch back process with respect to the resulting structure, so that the polysilicon layer is defined by the openings 66. Then, the anti-reflective layer 59 and the insulating layers 56 and 58 are removed so that the stable storage electrode layer 50 having the base section 52 and the top section 54 is achieved.

Since the storage electrode layer 50 has the base section 52 which is larger than the top section 54, the top section 54 is stably mounted on the base section 52.

In addition, the effective surface area is enlarged in the above mentioned structure of the storage electrode layer 50, so the cell capacitance is increased.

As mentioned above, the storage electrode layer consisting of the base section and the top section has a stable structure even when the height of the storage electrode exceeds 15,000 Å. Therefore, the storage electrode layer is prevented from tilting or falling down, so that the reliability of the semiconductor device can be improved. In addition, since the failure of the cell is prevented, the yield of the semiconductor device can be increased.

While the present invention has been described in detail with reference to the preferred embodiment thereof, it should be understood to those skilled in the art that various changes, substitutions and alterations can be made hereto without departing from the scope of the invention as defined by the appended claims.

What is claimed is:

1. A storage electrode of a semiconductor memory device, the storage electrode comprising:

a cylindrical base section having a first inner diameter; and a pipe-shaped top section having a second inner diameter smaller than the first inner diameter, wherein an upper end of the base section and a lower end of the top section extend towards each other at a same height so as to be connected to each other.

2. The storage electrode of a semiconductor memory device as claimed in claim 1, wherein a height of the base section is about 1,000 to 5,000 Å.

3. The storage electrode of a semiconductor memory device as claimed in claim 2, wherein a height of the top section is about 5,000 to 15,000 Å.

4. The storage electrode of a semiconductor memory device as claimed in claim 1, wherein a height of the storage electrode is at least 15,000 Å.

5. The storage electrode of claim 1, wherein a height of the top section is at least as great as a height of the base section.

6. The storage electrode of claim 1, wherein the cylindrical base section having the first diameter is directly connected to a buried contact plug.

7. The storage electrode of claim 6, wherein the cylindrical base section is connected to a bit line of a memory cell via the buried contact plug.

8. The storage electrode of claim 1, wherein the top section and the base section each comprise conductive polysilicon.

9. A storage electrode for a semiconductor device, comprising a hollowed-out bottom section disposed on a substrate; and a hollowed-out top section disposed on the hollowed-out bottom section, wherein a largest cross-section of the hollowed-out top section taken along a plane parallel to the substrate is smaller than a smallest cross-section of the hollowed-out bottom section taken along the plane parallel to the substrate.

10. The storage electrode of claim 9, wherein the hollowed-out bottom section has a cylindrical shape.

11. The storage electrode of claim 9, wherein the hollowed-out top section has a shape of a truncated cone.

12. The storage electrode of claim 9, wherein the cylindrical bottom section having the first diameter is directly connected to a buried contact plug.

13. The storage device of claim 12, wherein the cylindrical bottom section is connected to a bit line of a memory cell via the buried contact plug.

14. The storage electrode of claim 9, wherein the top section and the bottom section comprise conductive polysilicon.

15. The storage electrode of claim 9, wherein the bottom section is disposed on an insulating layer that is in turn disposed on a semiconductor substrate.

16. The storage electrode of claim 9, wherein the bottom section is disposed on an etch stopping layer that is in turn disposed on an insulating layer.

17. The storage electrode of claim 9, wherein a height of the top section of the storage electrode is about 5000 Å to 15,000 Å.

18. The storage electrode of claim 9, wherein a height of the top section is at least as great as a height of the bottom section.

* * * * *